(12) United States Patent
Ishikawa et al.

(10) Patent No.: US 9,025,628 B2
(45) Date of Patent: May 5, 2015

(54) SEMICONDUCTOR LASER

(71) Applicant: Sumitomo Electric Industries, Ltd., Osaka (JP)

(72) Inventors: Tsutomu Ishikawa, Yokohama (JP); Toshimitsu Kaneko, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/897,902

(22) Filed: May 20, 2013

(65) Prior Publication Data

US 2013/0308666 A1 Nov. 21, 2013

(30) Foreign Application Priority Data

May 18, 2012 (JP) .................................. 2012-115033
May 7, 2013 (JP) .................................. 2013-097899

(51) Int. Cl.
| | | |
|---|---|---|
| *H01S 3/04* | (2006.01) | |
| *H01S 5/12* | (2006.01) | |
| *H01S 5/026* | (2006.01) | |
| *H01S 5/0625* | (2006.01) | |
| *B82Y 20/00* | (2011.01) | |
| *H01S 5/028* | (2006.01) | |
| *H01S 5/06* | (2006.01) | |
| *H01S 5/10* | (2006.01) | |
| *H01S 5/343* | (2006.01) | |

(52) U.S. Cl.
CPC ................ *H01S 5/12* (2013.01); *H01S 5/0265* (2013.01); *H01S 5/06256* (2013.01); *H01S 5/06258* (2013.01); *B82Y 20/00* (2013.01); *H01S 5/028* (2013.01); *H01S 5/0612* (2013.01); *H01S 5/1003* (2013.01); *H01S 5/1209* (2013.01); *H01S 5/34306* (2013.01); *H01S 5/1212* (2013.01); *H01S 2301/176* (2013.01)

(58) Field of Classification Search
CPC ..... H01S 5/18; H01S 5/18327; H01S 5/1833; H01S 5/187
USPC ........................................................ 372/34
See application file for complete search history.

(56) References Cited

U.S. PATENT DOCUMENTS 4,796,273 A * 1/1989 Yamaguchi ..................... 372/96
5,325,392 A * 6/1994 Tohmori et al. ................. 372/96

(Continued)

FOREIGN PATENT DOCUMENTS

JP 2007-201425 A 8/2007
JP 2008-277758 A 11/2008

OTHER PUBLICATIONS

R. L. Moon, G. A. Antypasj, and L. W. James, "Bandgap and Lattice Constant of GaInAsP as a Function of Alloy Composition", Journal of Electronic Materials, vol. 3, No. 3, 1974.*

*Primary Examiner* — Xinning Niu
*Assistant Examiner* — Vu A Vu
(74) *Attorney, Agent, or Firm* — Westerman, Hattori, Daniels & Adrian, LLP

(57) ABSTRACT

A semiconductor laser includes: a first reflector that is provided in a gain region and has a sampled grating in which a plurality of segments are combined; and a second reflector that is optically connected to the first reflector and has a sampled grating in which a plurality of segments are combined, the plurality of segments of the first reflector having a short-segment region and a long-segment region, the long-segment region having an optical length that is larger than that of the short-segment region and being positioned closer to the second reflector than at least one of the short-segment region, the optical length of the long-segment region being larger than that of the short-segment region in a range of integral multiple (n≥1) plus-minus 25% of the optical length of the short-segment.

11 Claims, 11 Drawing Sheets

(56) References Cited

U.S. PATENT DOCUMENTS

| | | |
|---|---|---|
| 5,497,393 A * | 3/1996 | Lee ................................ 372/96 |
| 5,715,271 A * | 2/1998 | Huang et al. .................. 372/102 |
| 7,830,927 B2 * | 11/2010 | Reid et al. ....................... 372/20 |
| 2001/0048789 A1 * | 12/2001 | Shiozaki et al. ................ 385/37 |
| 2007/0036188 A1 * | 2/2007 | Fujii .......................... 372/50.11 |
| 2007/0263694 A1 | 11/2007 | Fujii |
| 2008/0247707 A1 | 10/2008 | Fujii |
| 2010/0158056 A1 * | 6/2010 | Shin et al. ................. 372/29.016 |
| 2011/0292955 A1 * | 12/2011 | Kaneko .......................... 372/20 |

* cited by examiner

FIRST EMBODIMENT

COMPARATIVE EXAMPLE

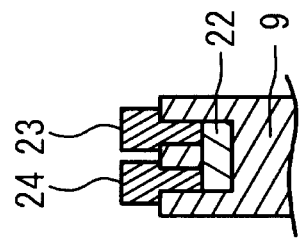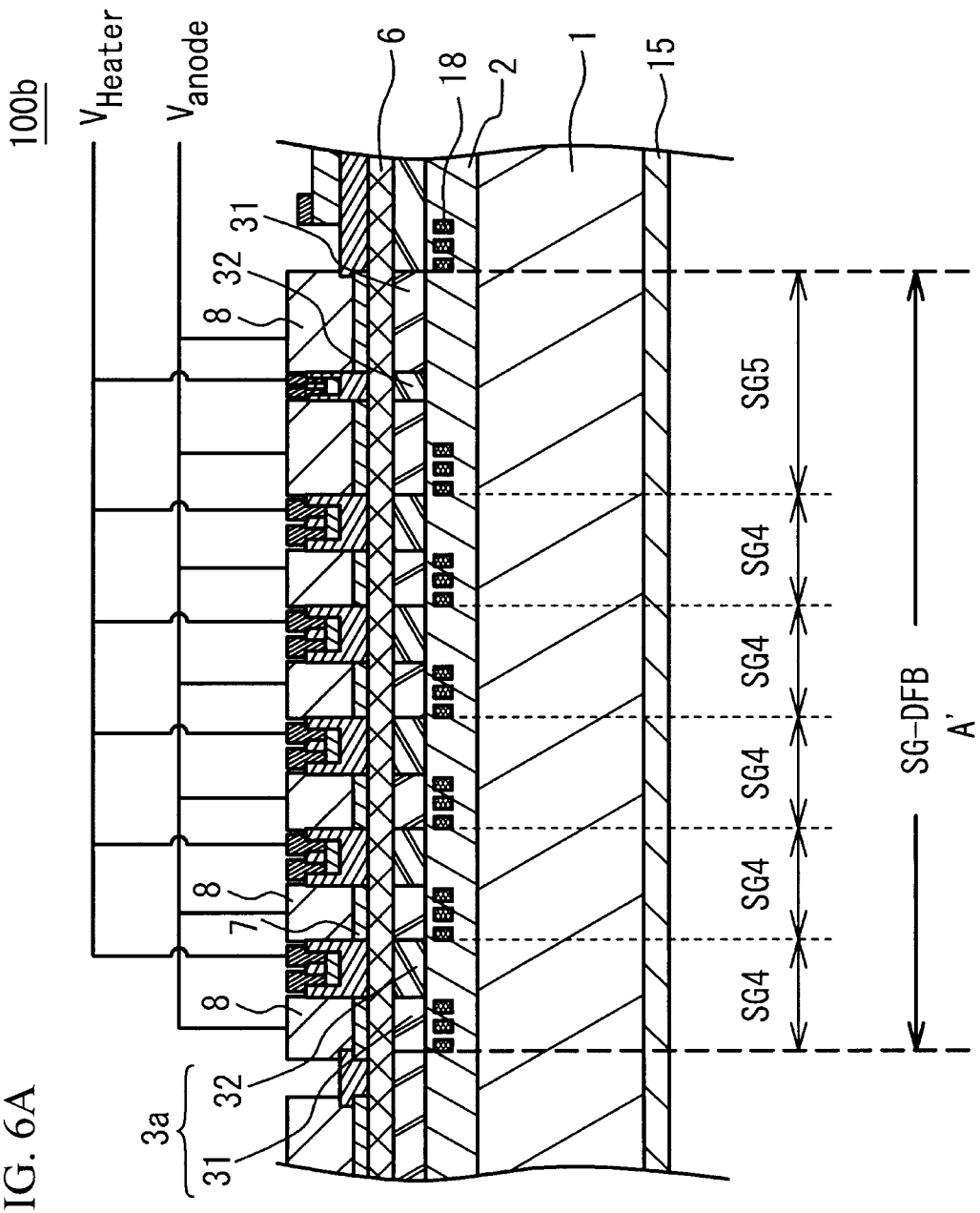

SEMICONDUCTOR LASER

CROSS-REFERENCE TO RELATED APPLICATION

This application is based upon and claims the benefit of priority of the prior Japanese Patent Applications No. 2012-115033, filed on May 18, 2012 and No. 2013-097899, filed on May 7, 2013, the entire contents of which are incorporated herein by reference.

BACKGROUND (i) Technical Field

The present invention relates to a semiconductor laser.

(ii) Related Art

A sampled grating, in which segments including a diffraction grating region having a diffraction grating and a space region are combined, is known. The sampled grating has a wavelength selection function. Japanese Patent Application Publication No. 2008-277758 (hereinafter referred to as Document 1) discloses a semiconductor laser in which a SG-DFB (Sampled Grating Distributed Feedback) region having a SG (Sampled Grating) and a gain and a SG-DBR (Sampled Grating Distributed Bragg Reflector) region not having a gain and acting as a wavelength selection mirror are combined.

SUMMARY

With use of the semiconductor laser of Document 1, optical intensity around a center of a resonator acting in the semiconductor laser is increased, and a carrier density in the resonator gets uneven because of a spatial hole burning effect. In this case, an oscillation mode may be unstable.

It is an object to provide a semiconductor laser that is capable of stabilizing the oscillation mode.

According to an aspect of the present invention, there is provided a semiconductor laser including: a first reflector that is provided in a gain region and has a sampled grating in which a plurality of segments are combined, the segment having a diffraction grating region and a space region next to the diffraction grating, both sides of the space region being sandwiched by a diffraction grating; and a second reflector that is optically connected to the first reflector and has a sampled grating in which a plurality of segments are combined, the segment having a diffraction grating region and a space region next to the diffraction grating, both sides of the space region being sandwiched by a diffraction grating, the plurality of segments of the first reflector having a short-segment region and a long-segment region, the long-segment region having an optical length that is larger than that of the short-segment region and being positioned closer to the second reflector than at least one of the short-segment region, the optical length of the long-segment region being larger than that of the short-segment region in a range of integral multiple ($n \geq 1$) plus-minus 25% of the optical length of the short-segment.

BRIEF DESCRIPTION OF THE DRAWINGS

FIG. 6A illustrates a schematic cross sectional view of an overall structure of a semiconductor laser in accordance with a third embodiment;

FIG. 6B illustrates an enlarged view of a heater;

DETAILED DESCRIPTION

A description will be given of a best mode for carrying the present invention.

Figure 1:
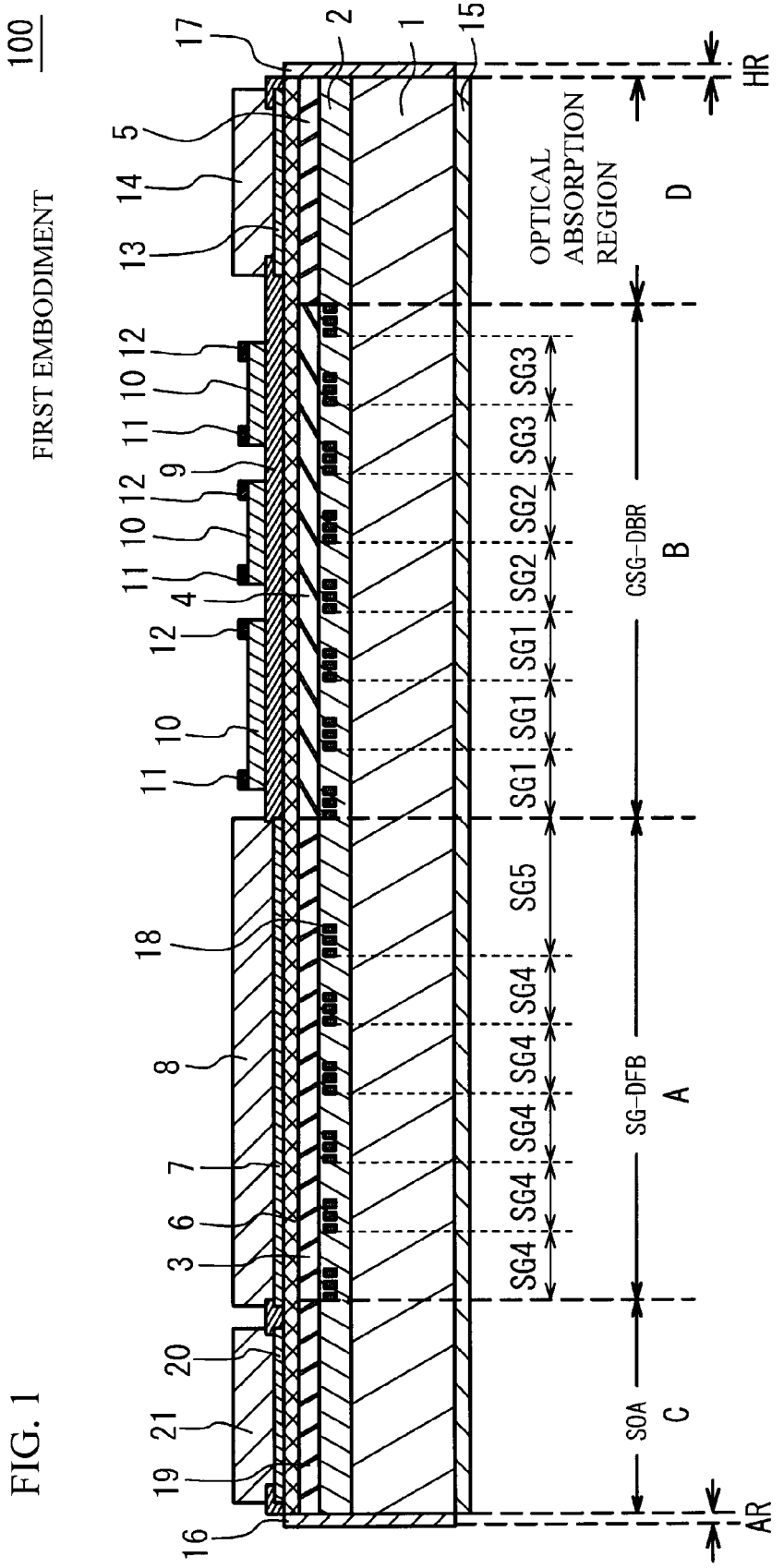
FIG. 1 illustrates an overall structure of a wavelength tunable semiconductor laser in accordance with a first embodiment.

FIG. 1 illustrates an overall structure of a wavelength-tunable semiconductor laser 100 in accordance with a first embodiment. As illustrated in FIG. 1, the semiconductor laser 100 has a SG-DFB (Sampled Grating Distributed Feedback) region A, a CSG-DBR (Chirped Sampled Grating Distributed Bragg Reflector) region B, an SOA (Semiconductor Optical Amplifier) region C, an optical absorption region D, an anti-reflection film AR and a reflection film HR.

As an example, the anti-reflection film AR, the SOA region C, the SG-DFB region A, the CSG-DBR region B, the optical absorption region D and the reflection film HR are arranged in this order from a front side to a rear side in the semiconductor laser 100. The SG-DFB region A has a gain and has a sampled grating. The CSG-DBR region B does not have a gain and has a sampled grating. The SOA region C acts as an optical amplifier.

The SG-DFB region A has a structure in which a lower cladding layer 2, an active layer 3, an upper cladding layer 6, a contact layer 7 and an electrode 8 are laminated on a substrate 1. The CSG-DBR region B has a structure in which the lower cladding layer 2, an optical waveguide layer 4, the upper cladding layer 6, an insulating film 9 and heaters 10 are laminated on the substrate 1. Each of the heaters 10 has a power supply electrode 11 and a ground electrode 12. The SOA region C has a structure in which the lower cladding layer 2, an optical amplification layer 19, the upper cladding layer 6, a contact layer 20 and an electrode 21 are laminated on the substrate 1. The optical absorption region D has a structure in which the lower cladding layer 2, an optical absorption layer 5, the upper cladding layer 6, a contact layer 13 and an electrode 14 are laminated on the substrate 1. An edge film 16 is made of an AR (Anti Reflection) film. A reflection film 17 is made of a HR (High Reflection) film.

The substrate 1, the lower cladding layer 2 and the upper cladding layer 6 are integrally formed in the SG-DFB region A, the CSG-DBR region B, the SOA region C and the optical absorption region D. The active layer 3, the optical waveguide layer 4, the optical absorption layer 5, and the optical amplification layer 19 are formed on an identical plane. An interface between the SG-DFB region A and the CSG-DBR region B corresponds to an interface between the active layer 3 and the optical waveguide layer 4.

The edge film 16 is formed on a facet of the substrate 1, the lower cladding layer 2, the optical amplification layer 19 and the upper cladding layer 6 on the side of the SOA region C. In the embodiment, the edge film 16 is an AR (Anti Reflection) film. The edge film 16 acts as a front facet of the semiconductor laser 100. The reflection film 17 is formed on a facet of the substrate 1, the lower cladding layer 2, the optical absorption layer 5, and the upper cladding layer 6 on the side of the optical absorption region D. The reflection film 17 acts as a rear facet of the semiconductor laser 100.

The substrate 1 is, for example, a crystal substrate made of n-type InP. The lower cladding layer 2 has n-type conductivity. The upper cladding layer 6 has p-type conductivity. The lower cladding layer 2 and the upper cladding layer 6 are, for example, made of InP. The lower cladding layer 2 and the upper cladding layer 6 confine a light in the active layer 3, the optical waveguide layer 4, the optical absorption layer 5 and the optical amplification layer 19.

The active layer 3 is made of a semiconductor having a gain. The active layer 3 may have a quantum well structure in which a well layer made of $Ga_{0.32}In_{0.68}As_{0.92}P_{0.08}$ having a thickness of 5 nm and a barrier layer made of $Ga_{0.22}In_{0.78}As_{0.47}P_{0.53}$ having a thickness of 10 nm are laminated alternately. The optical waveguide layer 4 is, for example, made of a bulk semiconductor layer, and may be made of $Ga_{0.22}In_{0.78}As_{0.47}P_{0.53}$. In the embodiment, the optical waveguide layer 4 has an energy gap larger than that of the active layer 3.

The optical absorption layer 5 may be made of a material absorbing a light with respect to an oscillation wavelength of the semiconductor laser 100. The optical absorption layer 5 is made of a material having an absorption edge wavelength at longer wavelength side relative to the laser oscillation wavelength of the semiconductor laser 100. It is preferable that the absorption edge wavelength is longer than the longest oscillation wavelength of the oscillation wavelengths of the semiconductor laser 100.

The optical absorption layer 5 may have a quantum well structure in which a well layer made of $Ga_{0.47}In_{0.53}As$ having a thickness of 5 nm and a barrier layer made of $Ga_{0.28}In_{0.72}As_{0.61}P_{0.39}$ having a thickness of 10 nm are laminated alternately. The optical absorption layer 5, is for example, made of a bulk semiconductor, and may be made of $Ga_{0.46}In_{0.54}As_{0.98}P_{0.02}$. The optical absorption layer 5 may be made of the same material as the active layer 3. In this case, the active layer 3 and the optical absorption layer 5 may be formed by a single process. Therefore, the manufacturing process may be simplified.

The optical amplification layer 19 is a region getting a gain and achieves an optical amplification when a current is provided from the electrode 21. The optical amplification layer 19 may have a quantum well structure in which a well layer made of $Ga_{0.35}In_{0.65}As_{0.99}P_{0.01}$ having a thickness of 5 nm and a barrier layer made of $Ga_{0.15}In_{0.85}As_{0.32}P_{0.68}$ having a thickness of 10 nm are laminated alternately. The optical amplification layer 19 may be made of a bulk semiconductor of $Ga_{0.44}In_{0.56}As_{0.95}P_{0.05}$. The optical amplification layer 19 may be made of the same material as the active layer 3. In this case, the active layer 3 and the optical amplification layer 19 may be formed by a single process. Therefore, the manufacturing process may be simplified.

The contact layers 7, 13 and 20 are, for example, made of p-type $Ga_{0.47}In_{0.53}As$ crystal. The insulating film 9 is a protective layer made of an insulator such as SiN or $SiO_2$. The heater 10 is a thin film resistor such as NiCr. Each heater 10 may extend through a plurality of segments of the CSG-DBR region B.

The electrodes 8 and 21, the power supply electrode 11 and the ground electrode 12 are made of conductive material such as Au (gold). A reverse face electrode 15 is formed on a lower face of the substrate 1. The reverse face electrode 15 extends through the SG-DFB region A, the CSG-DBR region B and the SOA region C.

The edge film 16 is an AR film having reflectivity of 1.0% or less, and thereby makes the facet substantially anti-reflection. The AR film may be a dielectric layer made of $MgF_2$, TiON or the like. The reflection film 17 is a HR film having reflectivity of 10% or more (for example, 20%). Therefore, the reflection film 17 is capable of suppressing an optical output leaking outside from the reflection film 17. For example, the reflection film 17 is a multi-layer film in which $SiO_2$ and TiON are alternately laminated three times. The reflectivity means reflectivity with respect to an inner portion of a semiconductor laser. Intrusion of a stray light entering the rear side facet from outside is suppressed, because the reflection film 17 has the reflectivity of 10% or more. The stray light entering the semiconductor layer 100 from the rear side facet is optically absorbed in the optical absorption layer 5. Therefore, reaching of the stray light to a resonator portion of the semiconductor laser 100 (that is, the SG-DFB region A and the CSG-DBR region B) is suppressed.

A plurality of diffraction gratings (corrugations) 18 are formed in the lower cladding layer 2 of the SG-DFB region A and the CSG-DBR region B at a given interval. Thus, a sampled grating is formed in the SG-DFB region A and the CSG-DBR region B. The SG-DFB region A and the CSG-DBR region B have a plurality of segments in the lower cladding layer 2. The segment is a region in which one region having the diffraction grating 18 and one space portion not having the diffraction grating 18 are combined. That is, the segment is a region in which a space region sandwiched by diffractive grating regions and a diffractive grating region are combined. The diffraction grating 18 is made of a material having a refractive index that is different from that of the lower cladding layer 2. The material of the diffraction grating 18 is, for example, made of $Ga_{0.22}In_{0.78}As_{0.47}P_{0.53}$ when the lower cladding layer 2 is made of InP.

The diffraction grating 18 may be formed by a patterning with use of a dual beam interference exposure method. The space region between two diffraction gratings 18 may be formed by exposing a resist with a pattern of the diffraction grating 18 and exposing a region of the resist corresponding to the space region after that. A pitch of the diffraction grating 18 of the SG-DFB region A may be the same as that of the diffraction grating 18 of the CSG-DBR region B, and may be different from that of the diffraction grating 18 of the CSG-DBR region B. In the embodiment, for example, the pitch of the diffraction grating 18 of the SG-DFB region A is the same as that of the diffraction grating 18 of the CSG-DBR region B. A length of the diffraction grating 18 of each segment may be an identical or different from each other. Each of the diffraction grating 18 of the SG-DFB region A may be an identical. Each of the diffraction grating 18 of the CSG-DBR region B may be an identical. And, the length of the diffraction grating

18 of the SG-DFB region A may be different from that of the diffraction grating 18 of the CSG-DBR region B.

In the CSG-DBR region B, at least two of the segments have a different optical length. Thus, peak intensity of wavelength characteristics of the CSG-DBR region B depends on wavelength. In the embodiment, for example, the CSG-DBR region B has seven segments. Three segments SG1 having an identical optical length, two segments SG2 having an identical optical length, and two segments SG3 having an identical optical length are combined from the SG-DFB region A side. The optical length of the segments SG1 to SG3 is approximately 180 µm, and is different from each other. The segments of the SG-DFB region A act as a first reflector. The segments of the CSG-DBR region B act as a second reflector.

The SG-DFB region A has a long-segment (long-segment region) having a relatively long optical length and a short-segment (short-segment region) having a relatively short optical length. The long-segment is closer to the CSG-DBR region B than at least one of the short-segments. The long-segment has an optical length larger than that of the short-segment in a range of integral multiple (n≥1) plus-minus 25% of the short-segment. That is, the optical length of the long-segment is the optical length of the short-segment plus the optical length of integral multiple plus-minus 25% of the short-segment.

The optical length of the diffraction grating region of the long-segment is 10% or less of the optical length of the long-segment. The optical length of the diffraction grating region of the short-segment is 10% or less of the optical length of the short-segment. That is, it is preferable that the optical length of the diffraction grating of the long-segment and the short-segment is respectively 10% or less of a segment of the long-segment and the short-segment.

In the embodiment, for example, the SG-DFB region A has six segments. Five short-segments SG4 having an identical optical length are combined from the SOA region C side, and one long-segment SG5 is combined on the side of the CSG-DBR region B. The optical length of the short-segment SG4 is different from that of the segments SG1 to SG3, and is, for example, 160 µm. The optical length of the long-segment SG5 is, for example, 320 µm. The segments SG1 to SG3 of the CSG-DBR region B, the short segments SG4 and the long-segment SG5 of the SG-DFB region A act as a resonator of the semiconductor laser 100. The optical length of the diffraction grating region of the segments SG1 to SG3 of the CSG-DBR region B, the short-segments SG4 and the long-segment SG5 of the SG-DFB region A is approximately 4 µm.

In the embodiment, the optical length of the long-segment is enlarged by enlarging the optical length of the space region of the long-segment compared to the optical length of the space region of the short-segment. However, the optical length of the long-segment may be enlarged by enlarging the optical length of the diffraction grating of the long-segment compared to the optical length of the diffraction grating of the short-segment. The optical length of the long-segment may be enlarged by enlarging both of the optical length of the space region and the optical length of the diffraction grating.

Figure 2A:
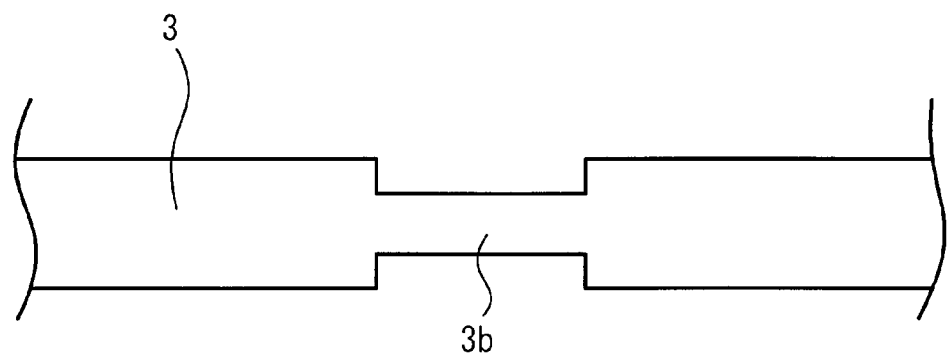
FIG. 2A to FIG. 2C illustrate a top view for describing a phase shift structure.
Figure 2B:
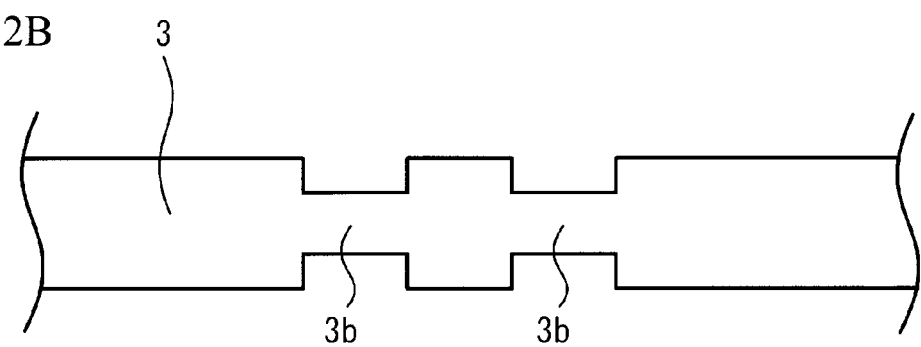
Figure 2C:
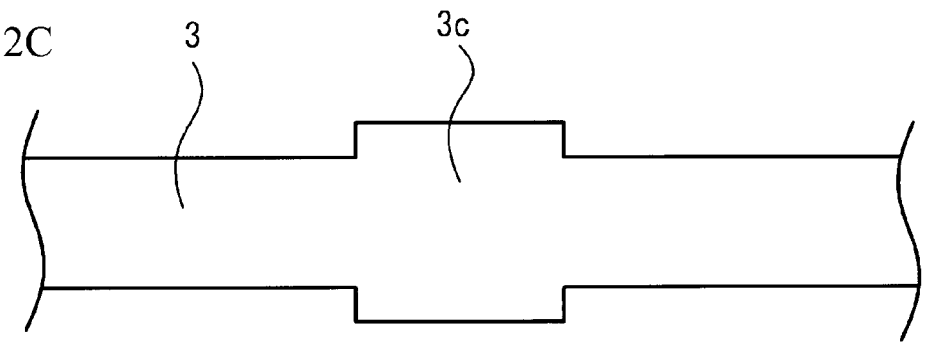

A phase shift structure for achieving 90-degree-shift of a light propagating in the resonator of the semiconductor laser 100 is provided in the semiconductor laser 100 in order to phase matching between a propagating light toward the front side and a propagating light toward the rear side. In the embodiment, the long-segment SG5 has the phase shift structure. In concrete, the space region of the long-segment SG5 has a waveguide region of which width is reduced or enlarged. FIG. 2A illustrates a top view of the long-segment SG5. As illustrated in FIG. 2A, the space region of the long-segment SG5 may have a width-reduced region 3*b*. As illustrated in FIG. 2B, the width-reduced region 3*b* may be divided into a plurality of regions in the space region. As illustrated in FIG. 2C, a width-enlarged region 3*c* may be provided instead of the width-reduced region 3*b*. With these structures, a propagation constant changes at an interface between waveguides. The changing of the propagation constant causes a phase shift. A changing amount of a width of a waveguide determines a changing amount of the propagation constant. When the phase shift is used by the method, the structural phase of the diffraction grating in the SG-DFB region A and the CSG-DBR region B is identical.

There are various methods for providing a phase shift. The phase shift may be provided when a phase of a structural pitch of a diffraction grating is shifted with a part of the SG-DFB region A or the CSG-DBR region B being an interface. The interface may be a space region or a diffraction grating region. It is preferable that the interface is positioned around a center of a resonator (around the segment SG5 in the first embodiment). There is a method of using a material as a part of an optical waveguide of which refraction index is different from the rest, as the phase shift structure.

Next, a description will be given of an operation of the semiconductor laser 100. When a predetermined driving current is provided to the electrode 8, the active layer 3 generates a light. The light generated by the active layer 3 is repeatedly reflected and amplified in the active layer 3 and the optical waveguide layer 4, and is laser-oscillated. The light reflected by each segment interferes with each other. Thus, a discrete gain spectrum in which peak intensity has a given wavelength interval is generated in the SG-DFB region A. And a discrete reflection spectrum in which peak intensity has a given wavelength interval is generated in the CSG-DBR region B. When the gain spectrum and the reflection spectrum are combined, the semiconductor laser 100 stably oscillates at a desirable wavelength with use of a vernier effect.

When a predetermined electrical power is provided to the power supply electrode 11, each heater 10 generates heat at a predetermined temperature. A TEC (Thermoelectric cooler) controls the temperature of the semiconductor laser 100 to be a predetermined temperature. Thus, an oscillation wavelength is selected. The laser light is output from a front facet (on the side of the SOA region C) to outside. When a predetermined driving current is provided to the electrode 21, optical intensity of the laser light output from the semiconductor laser 100 is controlled to be a predetermined value. In the embodiment, the intensity of peaks of the wavelength characteristics of the CSG-DBR region B depends on a wavelength. Therefore, a stable laser oscillation can be achieved.

Figure 3:
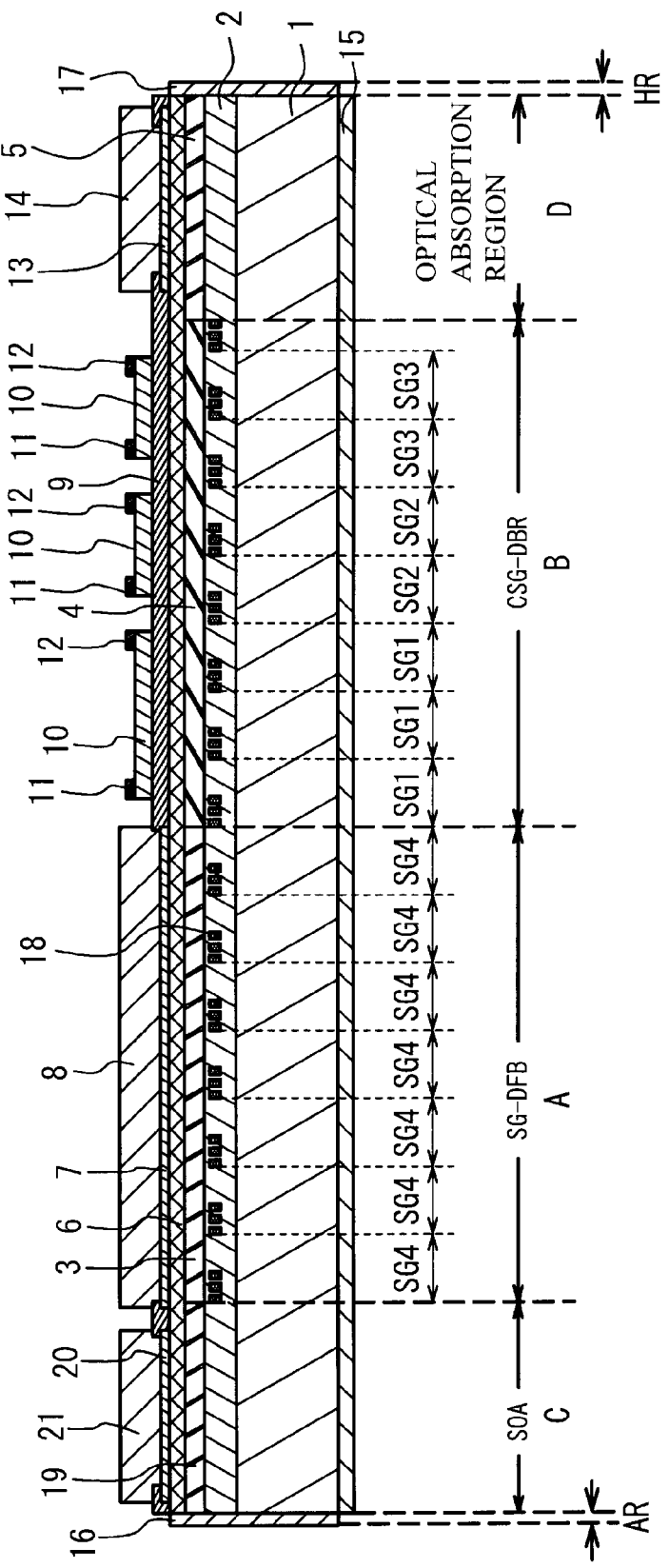
FIG. 3 illustrates a schematic cross sectional view of an overall structure of a semiconductor laser in accordance with a comparative example.

Next, a description will be given of an effect of the long-segment in the SG-DFB region A. A description will be given of a comparative example in order to describe the effect. FIG. 3 illustrates a schematic cross sectional view of an overall structure of a semiconductor laser 200 in accordance with the comparative example. The semiconductor laser 200 is different from the semiconductor laser 100 in points that two short-segments SG4 are provided instead of the long-segment SG5 in the SG-DFB region A, and the optical length of each segment of the SG-DFB region A is identical.

Figure 4B:
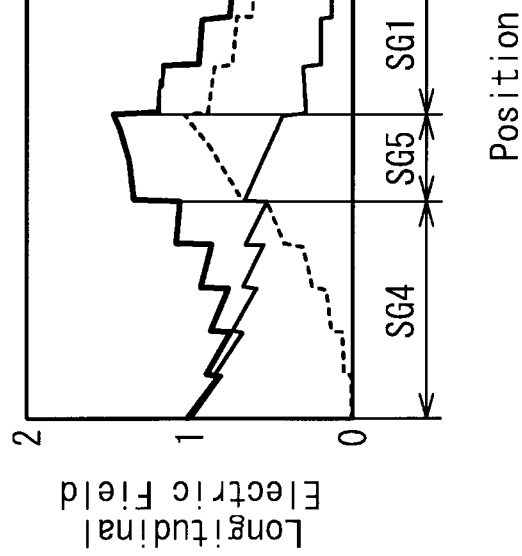
FIG. 4B illustrates an optical intensity distribution in a resonator of the semiconductor laser in accordance with the first embodiment.
Figure 4A:
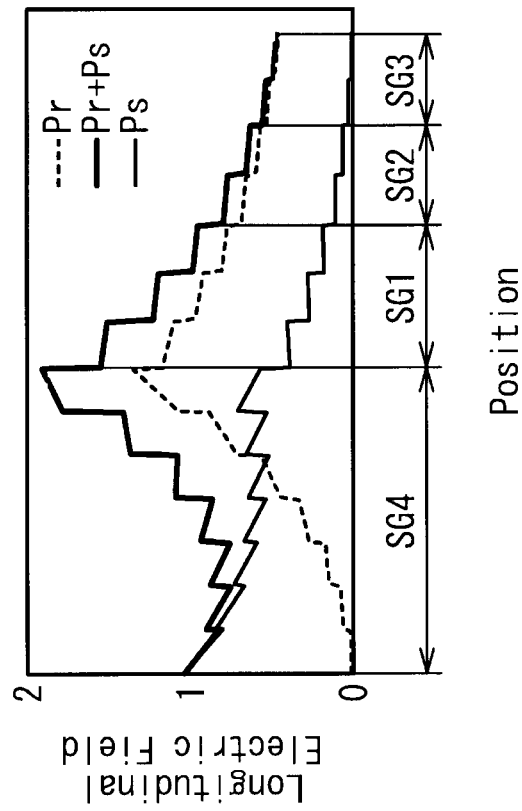
FIG. 4A illustrates an optical intensity distribution in a resonator of the semiconductor laser in accordance with the comparative example.

FIG. 4A illustrates an optical intensity distribution in a resonator of the semiconductor laser 200 in accordance with the comparative example. In FIG. 4A, a horizontal axis indicates a position in the resonator. In concrete, the horizontal axis indicates a segment in the SG-DFB region A and the CSG-DBR region B. In FIG. 4A, "SG4" corresponds to the seven short-segments SG4. A vertical axis indicates optical intensity. In FIG. 4A, "Ps" indicates a propagation light toward the front side. "Pr" indicates a propagation light toward the rear side. "Pr+Ps" indicates a total of the propagation light toward the front side and the propagation light toward the rear side.

A part of the propagation light toward the front side and the propagation light toward the rear side is reflected by each segmet, and acts as a propagation light toward a reverse side. Thereby, optical intensity discontinuously changes at each segment. In particular, when the above-mentioned phase shift structure is provided in order to make a phase matching between the propagation light toward the front side and the propagation light toward the rear side, the optical intensity of the propagation light greatly changes at a segment near the phase shift structure. In the SG-DFB region A, the propagation light is amplified by the gain of the SG-DFB region A. Therefore, the optical intensity of the propagation light "Ps" toward the front side gets larger on the front side of the SG-DFB region A. Therefore, the optical intensity of the propagation light "Ps" toward the front side gradually gets larger from the CSG-DBR region B to the SG-DFB region A. On the other hand, in the SG-DFB region A, the propagation light "Pr" toward the rear side is larger on the rear side of the SG-DFB region A because of the amplification by the gain of the SG-DFB region A, and is smaller on the rear side of the CSG-DBR region B.

At an edge of the front side and the rear side of the resonator, there is only the propagation light (Ps) toward the front side or the propagation light (Pr) toward the rear side. Therefore, the optical intensity is suppressed at the front side edge and the rear side edge. On the other hand, around the center of the resonator, the optical intensity of the propagation light (Ps) toward the front side and the propagation light "Pr" toward the rear side gets larger. Further, the propagation light "Pr" toward the rear side has a local maximum value around the center of the resonator. Therefore, the total "Pr+Ps" of the propagation light "Ps" and the propagation light "Pr" gets larger around the center of the resonator. When the phase shift structure is provided in the resonator in order to make a phase matching, the optical intensity gets larger in a segment near the phase shift structure.

In a region where the optical intensity is larger, a carrier density gets smaller because of a spatial hole burning effect. In this case, the carrier density gets uneven in the resonator. Thereby, there is a refraction index difference among each segment in the SG-DFB region A. The interference effect gets smaller. And, the oscillation mode may get unstable.

FIG. 4B illustrates an optical intensity distribution of the resonator in the semiconductor laser 100 in accordance with the first embodiment. A horizontal axis and a vertical axis indicate the same as FIG. 4A. As illustrated in FIG. 4B, optical intensity around the center of the resonator is suppressed and gets flatter, compared to FIG. 4A. This is because a multiple reflection is suppressed and the changing amount of the optical intensity gets smaller, because the space region of the long-segment SG5 is longer in the SG-DFB region A. And, the interference effect among each segment is achieved, because the optical length of the long-segment SG5 is larger than that of the short-segment SG4 by integral multiple plus-minus 25% of the short-segment SG4.

Second Embodiment

Figure 5A:
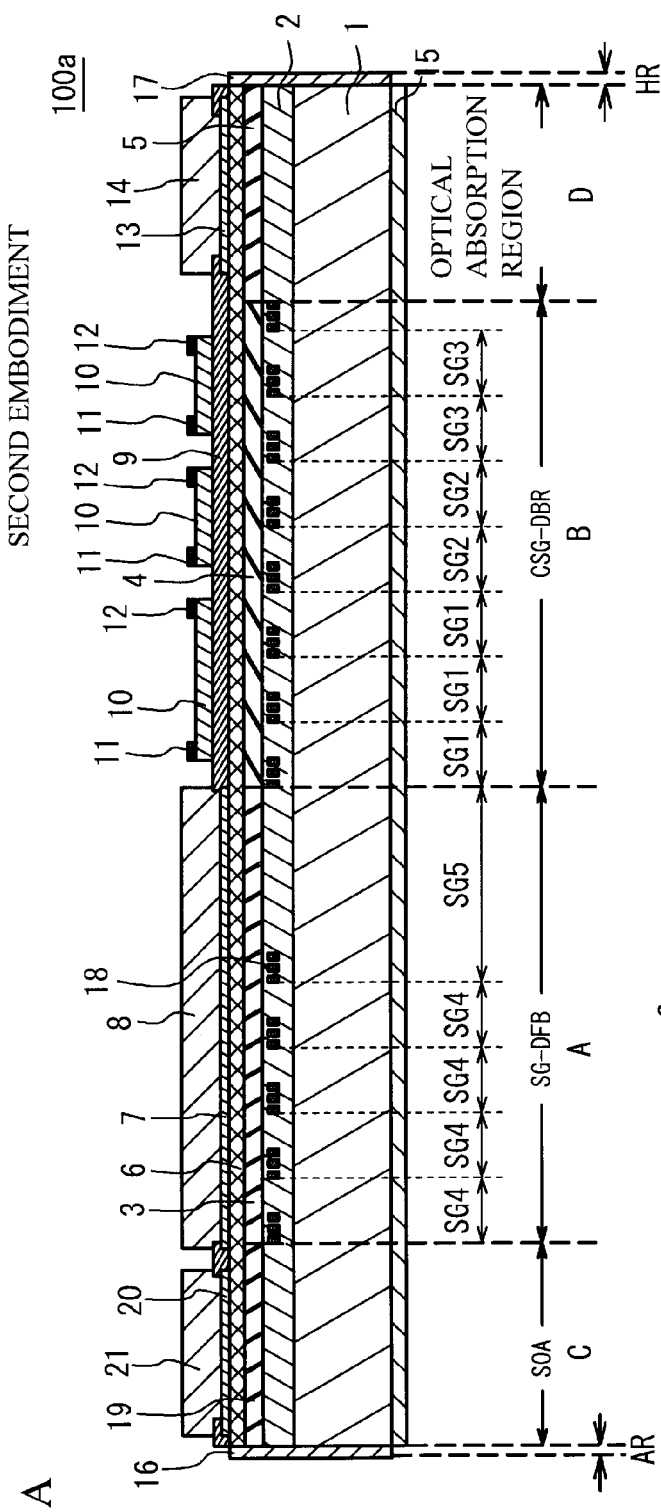
FIG. 5A illustrates a schematic cross sectional view of a semiconductor laser in accordance with a second embodiment.

FIG. 5A illustrates a schematic cross sectional view of a semiconductor laser 100a in accordance with a second embodiment. The semiconductor laser 100a is different from the semiconductor laser 100 in a point that the optical length of the long-segment SG5 is larger than that of the short-segment SG4 by twice plus-minus 25% of the short-segment SG4. For example, the optical length of the short-segment SG4 is 160 µm. The optical length of the long-segment SG5 is 480 µm. The number of the short-segment SG4 is set to be four, because the long-segment SG5 gets longer. The length of the diffraction grating region of the short-segment SG4 and the long-segment SG5 is approximately 4 µm.

Figure 5B:
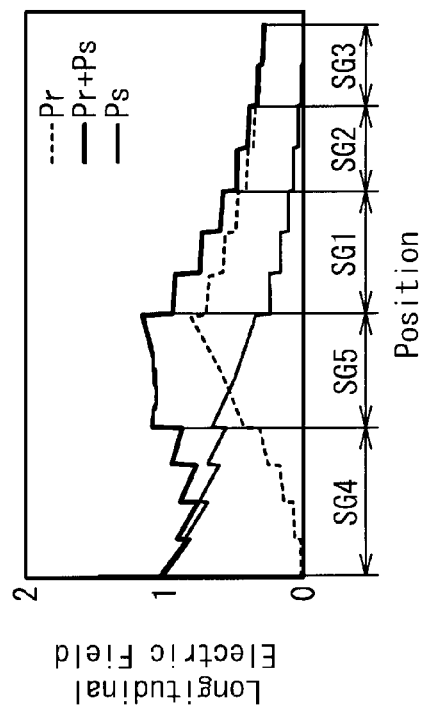
FIG. 5B illustrates an optical intensity distribution of a resonator in the semiconductor laser in accordance with the second embodiment.

FIG. 5B illustrates an optical intensity distribution of a resonator in the semiconductor laser 100a. In FIG. 5B, a horizontal axis indicates a position of the resonator. A vertical axis indicates the optical intensity. In FIG. 5B, "Ps" indicates a propagation light toward the front side. "Pr" indicates a propagation light toward the rear side. "Pr+Ps" indicates total of the propagation light toward the front side and the propagation light toward the rear side.

As illustrated in FIG. 5B, the optical intensity around the center of the resonator is more suppressed and gets flatter, compared to FIG. 4B. This is because the optical length of the long-segment SG5 gets larger in the SG-DFB region A, and the changing amount of the optical intensity gets smaller. And, the interference effect among each segment is achieved, because the optical length of the long-segment SG5 is larger than that of the short-segment SG4 by integral multiple plus-minus 25% of the short-segment SG4.

Third Embodiment

In the first embodiment and the second embodiment, the uniform active layer 3 is provided in the SG-DFB region A. The active layer 3 may include a plurality of waveguides in a resonator direction of which equivalent refraction index is tunable. Typically, the waveguides do not have a gain. The waveguides may be made of the same material as the optical waveguide layer 4 of the CSG-DBR region B. A heater for tuning the equivalent refraction index may be provided above the waveguides. An electrode for providing an electrical current may be provided instead of the heater. The waveguide and the active layer 3 may be alternately arranged in each segment of the SG-DFB region A. The waveguide may extend from one segment to another segment adjacent to the one segment. It is possible to achieve a detailed frequency control of an oscillation wavelength (Fine Tuning) by controlling the equivalent refraction index of the waveguide instead of temperature changing of the SG-DFB region A.

FIG. 6A illustrates a schematic cross sectional view of an overall structure of a semiconductor laser 100b in accordance with a third embodiment. The semiconductor laser 100b is different from the semiconductor laser 100 in a point that a SG-DFB region A' is provided instead of the SG-DFB region A. The structure of the CSG-DBR region B and the SOA region C is the same as FIG. 1. Therefore, a part of the CSG-DBR region B and the SOA region C is omitted in FIG. 6A.

In the SG-DFB region A', a waveguide 3a is provided instead of the uniform active layer 3. The waveguide 3a has a structure in which a gain region 31 and a passive waveguide 32 not having a gain are alternately arranged along a propagation direction. The gain region 31 is provided above a region including at least the diffraction grating 18 of the short-segment SG4 and the long-segment SG5. The gain region 31 has the same structure as the active layer 3 of the first embodiment and the second embodiment. The contact layer 7 and the electrode 8 are provided above the gain region 31, as well as the first embodiment and the second embodiment.

The passive waveguide 32 is provided at a region other than the gain region 31 in the short-segment SG4 and the long-segment SG5. Therefore, in each segment, the gain region 31 is provided in the region including the diffraction grating 18, and the passive waveguide 32 is provided in at least a part of the space region. The passive waveguide 32 is, for example, made of such as an InGaAsP-based bulk layer having a PL wavelength difference of 200 nm or more or an AlGaInAsP-based quantum well structure having a PL wavelength difference of 200 nm or more. A heater 22 is provided on the insulating film 9 above the upper cladding layer 6 of the passive waveguide 32. The heater 22 has a power supply electrode 23 and a ground electrode 24.

In the long-segment SG5, the gain region 31, the passive waveguide 32 and another gain region 31 are arranged from the short-segment SG4 side. Therefore, the long-segment SG5 has two short-segments. In the long-segment SG5, the gain region and the passive waveguide on the side of the CSG-DBR region B are reversely arranged. Thereby, a gain region, a passive region, another passive region and another gain region are arranged in this order. Therefore, the long-segment SG5 has a structure in which the passive waveguide 32 is sandwiched by the gain regions 31. As mentioned above, the two passive waveguides act as a single passive waveguide.

The long-segment SG5 has the gain region 31 at the edge on the side of the CSG-DBR region B. This is because there is influence on the passive waveguide 32 of the CSG-DBR region B when the passive waveguide 32 of the long-segment SG5 is controlled, if the passive waveguide 32 is provided at the edge on the side of the CSG-DBR region B. Therefore, the gain region 31 is provided at the edge on the side of the CSG-DBR region B. When the gain region 31 is provided at the edge on the side of the CSG-DBR region B, the long-segment SG5 has the structure in which the passive waveguide 32 is sandwiched by the gain regions 31.

FIG. 6B illustrates an enlarged view of the heater 22. As illustrated in FIG. 6A and FIG. 6B, the heater 22 is provided on the insulating film 9 above the upper cladding layer 6 on the passive waveguide 32. The heater 22 has the power supply electrode 23 and the ground electrode 24. The ground electrode 24 is connected to a common terminal having a reference potential. As mentioned above, the long-segment SG5 has two short-segments. The heater above the long-segment SG5 has a structure of two heaters of the short-segment SG4.

In FIG. 6A, a common voltage $V_{anode}$ is applied to each of the electrodes 8. A common voltage $V_{Heater}$ is applied to each of the power supply electrodes 23 of the heater 22. The length of the passive waveguide 32 is expressed as "$L_{tune}$". The changing amount of the refraction index of the passive waveguide 32 is expressed as "$\Delta n$". The changing amount of temperature of the passive waveguide 32 is expressed as "$\Delta T$". In this case, the changing amount of the phase of the passive waveguide 32 is expressed as $$\Delta\phi \propto \Delta n \cdot L_{tune} \propto \Delta T \cdot L_{tune}$$

Next, the voltage applied to the heater 22 is expressed as "V". The resistance of the heater 22 is expressed as "$R_{Heater}$". In this case, an electrical power supplied to the heater 22 is expressed as $$P = V^2/R_{Heater} \propto V^2/L_{tune}$$

It is assumed that the length of the passive waveguide 32 is substantially the same as that of the heater 22. Next, the length of the segment is expressed as "$L_{SG}$". In this case, a shift amount of a wavelength of the laser oscillation mode is expressed as $$\Delta\lambda \propto \Delta\phi/L_{SG} \propto L_{tune}/L_{SG} \cdot \Delta T \propto P/L_{SG} \propto V^2/(L_{SG} \cdot L_{tune})$$

It is preferable that the $L_{tune}$ is reduced to half when the $L_{SG}$ is doubled, because the common voltage $V_{Heater}$ is applied to the power supply electrode 23 of each heater 22 in the example of FIG. 6A. It is therefore preferable that the length of the passive waveguide 32 and the heater 22 of the long-segment SG5 is approximately 40 μm, when the length of the passive waveguide 32 and the heater 22 of the five short-segments SG4 is approximately 80 μm.

In the embodiment, the short-segment SG4 and the long-segment SG5 have the passive waveguide 32. The passive waveguide 32 has the heater 22. The heater 22 is capable of controlling the refraction index of the passive waveguide 32 and is capable of shifting the phase of the light propagating in the resonator of the semiconductor laser 100. It is therefore possible to shift the phase even if the phase shift structure of the first embodiment is not provided.

Figure 7:
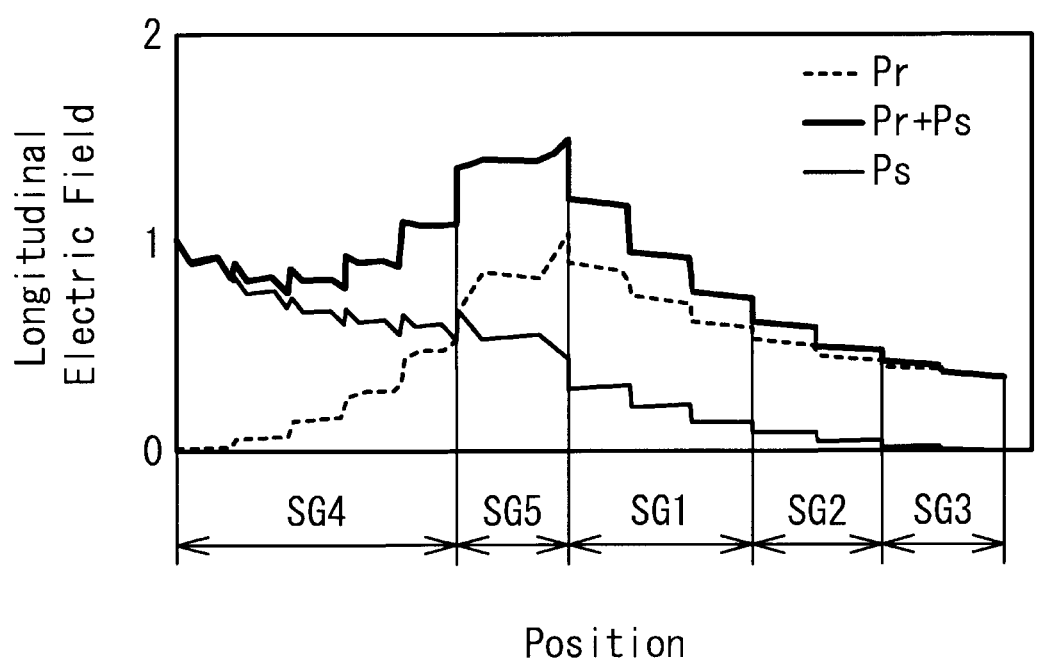
FIG. 7 illustrates an optical intensity distribution of a resonator.

FIG. 7 illustrates an optical intensity distribution of a resonator in the semiconductor laser 100b. In FIG. 7, a horizontal axis indicates a position of the resonator. A vertical axis indicates the optical intensity. In FIG. 7, "Ps" indicates a propagation light toward the front side. "Pr" indicates a propagation light toward the rear side. "Pr+Ps" indicates total of the propagation light toward the front side and the propagation light toward the rear side.

As illustrated in FIG. 7, optical intensity around the center of the resonator is suppressed and gets flatter. This is because a multiple reflection is suppressed and the changing amount of the optical intensity gets smaller, because the long-segment SG5 is longer in the SG-DFB region A. And, the interference effect among each segment is achieved, because the optical length of the long-segment SG5 is larger than that of the short-segment SG4 by integral multiple plus-minus 25% of the short-segment SG4.

First Modified Embodiment

Figure 8:
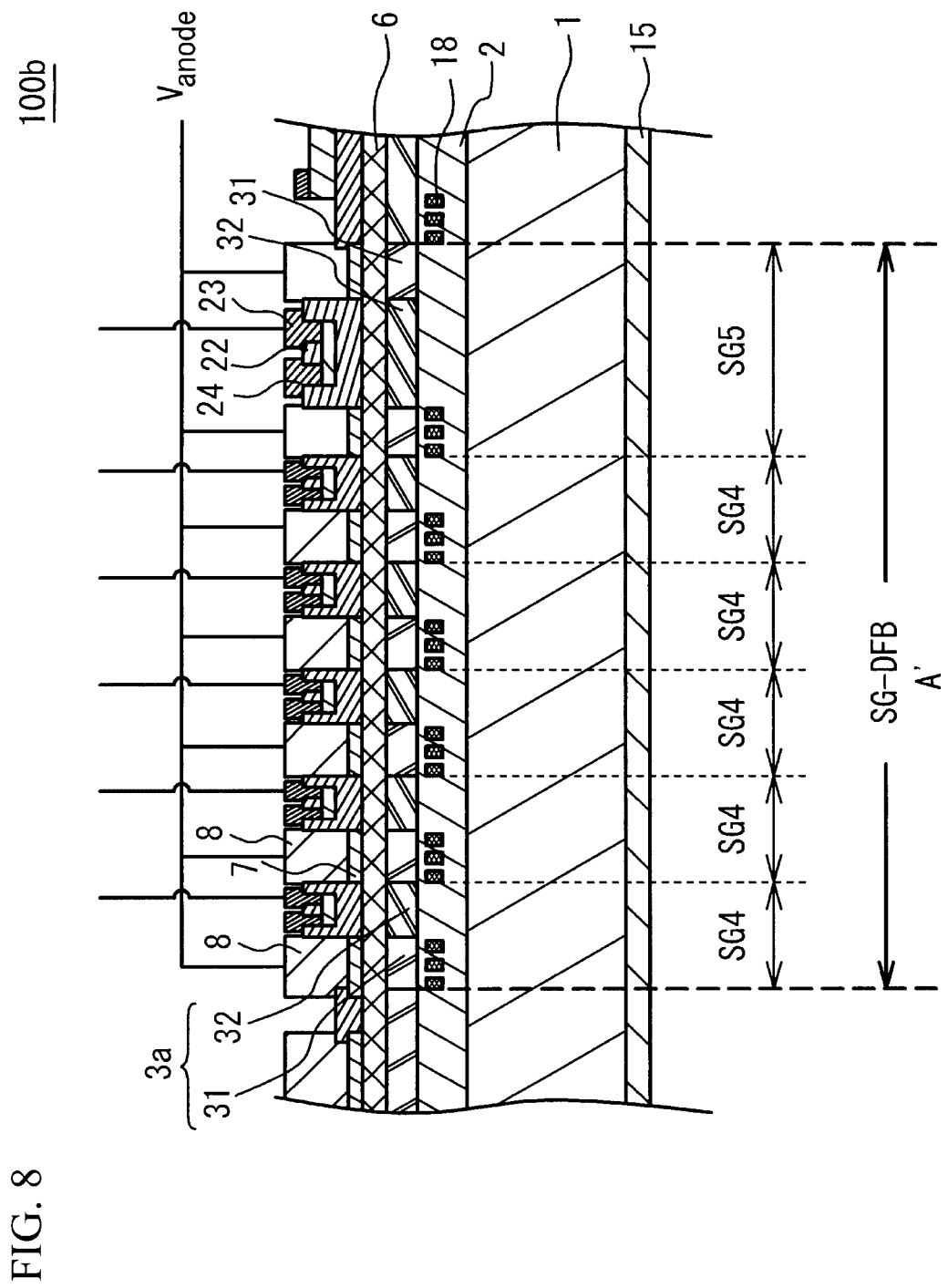
FIG. 8 illustrates a schematic cross sectional view of another semiconductor laser.

As illustrated in FIG. 8, the power supply electrode 23 of each heater 22 may be connected to power supplies that are independent from each other. In this case, it is possible to independently control the heater 22 of the long-segment SG5 and the hater 22 of the short-segment SG4. A next formula is obtained from the above-mentioned formulas.

$$\Delta T \propto L_{SG}/L_{tune} \cdot \Delta\lambda$$

It is preferable that the length of the passive waveguide 32 is enlarged in proportion to the length of the segment, in order to equalize the changing amount of temperature of the short-segment SG4 and the long-segment SG5. It is therefore preferable that the length of the passive waveguide 32 and the heater 22 of the long-segment SG5 is approximately 160 μm when the length of the passive waveguide 32 and the heater 22 of the five short-segments SG4 is approximately 80 μm. The length of the diffraction grating region of the short-segment SG4 and the long-segment SG5 is approximately 4 μm. The other structure is the same as the third embodiment. Therefore, the other structure is omitted. The longer the passive waveguide 32 and the heater 22 are, the lower the heater temperature for achieving a desirable wavelength adjust range may be.

Second Modified Embodiment

Figure 9:
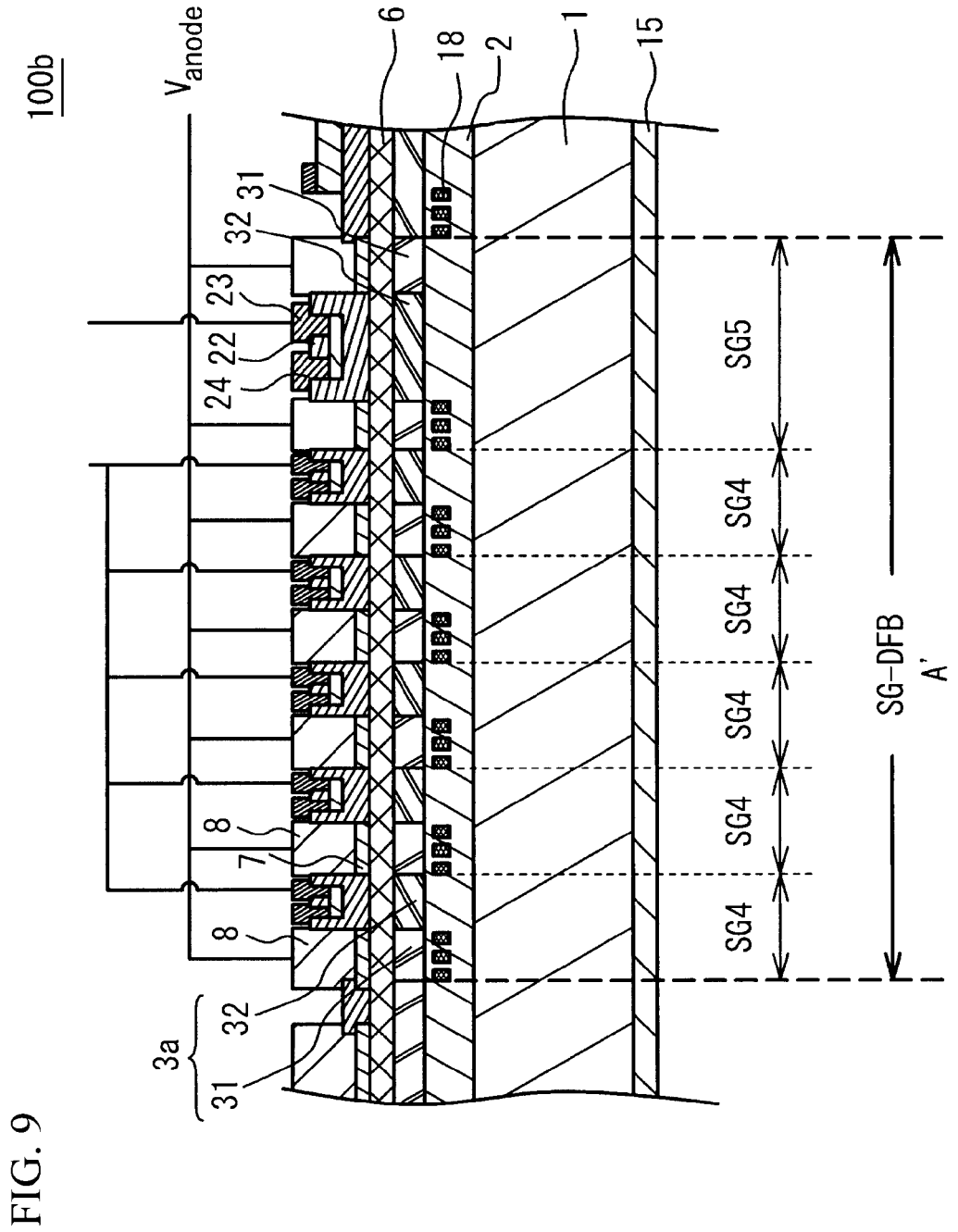
FIG. 9 illustrates a schematic cross sectional view of another semiconductor laser.

As illustrated in FIG. 9, the power supply electrode 23 of the heater 22 of each short-segment SG4 may be connected to a common power supply and may be connected to a power supply that is independent from the heater 22 of the long-segment SG5. With the structure, a number of the independent power supplies can be reduced. The other structure is the same as the first modified embodiment, and is thereby omitted.

Third Modified Embodiment

Figure 10:
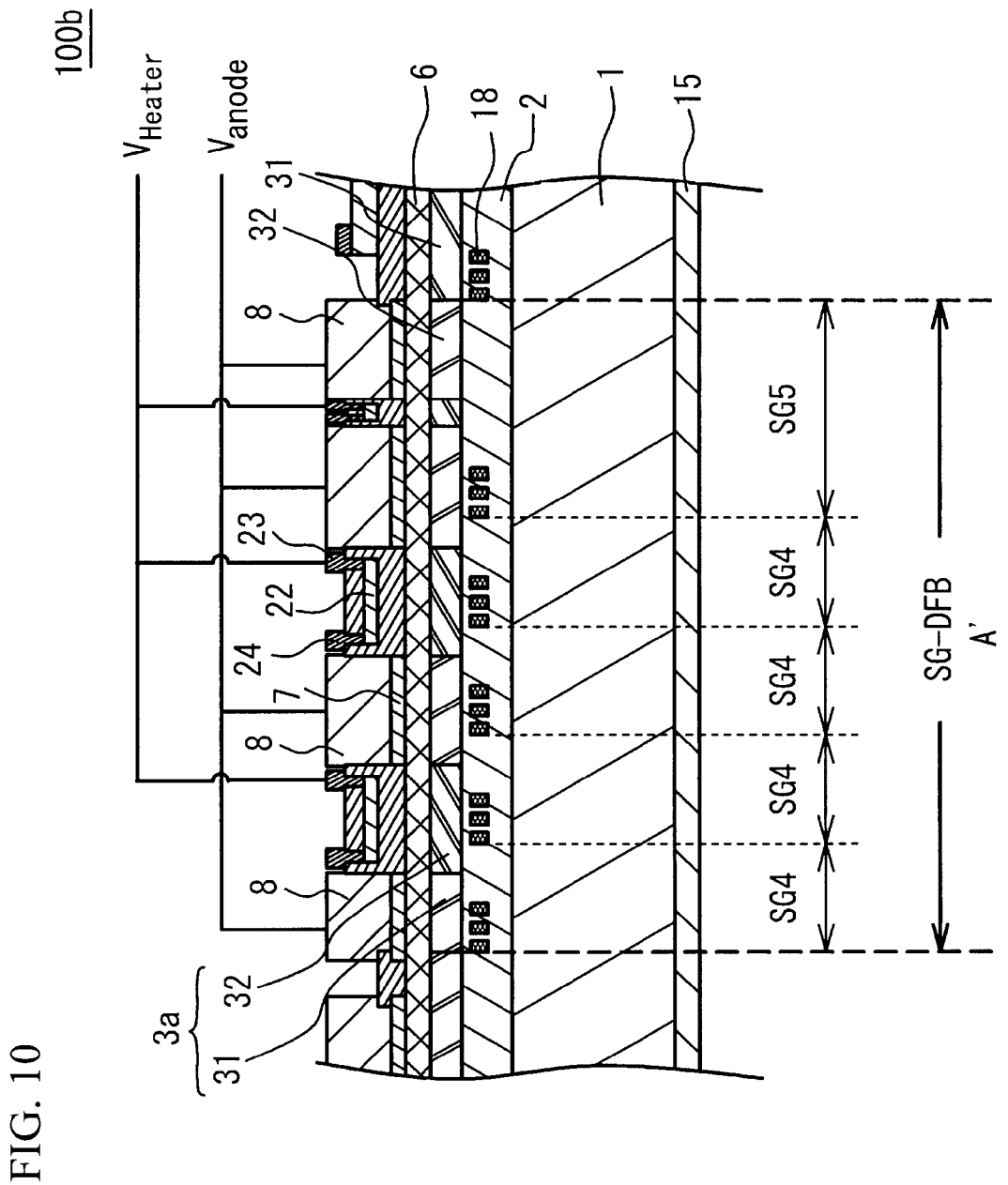
FIG. 10 illustrates a schematic cross sectional view of another semiconductor laser.

The gain region 31 and the passive waveguide 32 may extend from one segment to another segment. With the structure, a number of Butt-Joint between the gain region 31 and the passive waveguide 32 can be reduced. FIG. 10 illustrates an example in which each group of the gain region 31 and the passive waveguide 32 extends from one segment to another segment in the structure of FIG. 6A. The length of the passive waveguide 32 and the hater 22 of each short-segment SG4 is approximately 160 μm. The length of the passive waveguide 32 and the heater 22 of the long-segment SG5 is approximately 40 μm. The other structure is the same as the third embodiment, and is thereby omitted.

Figure 11:
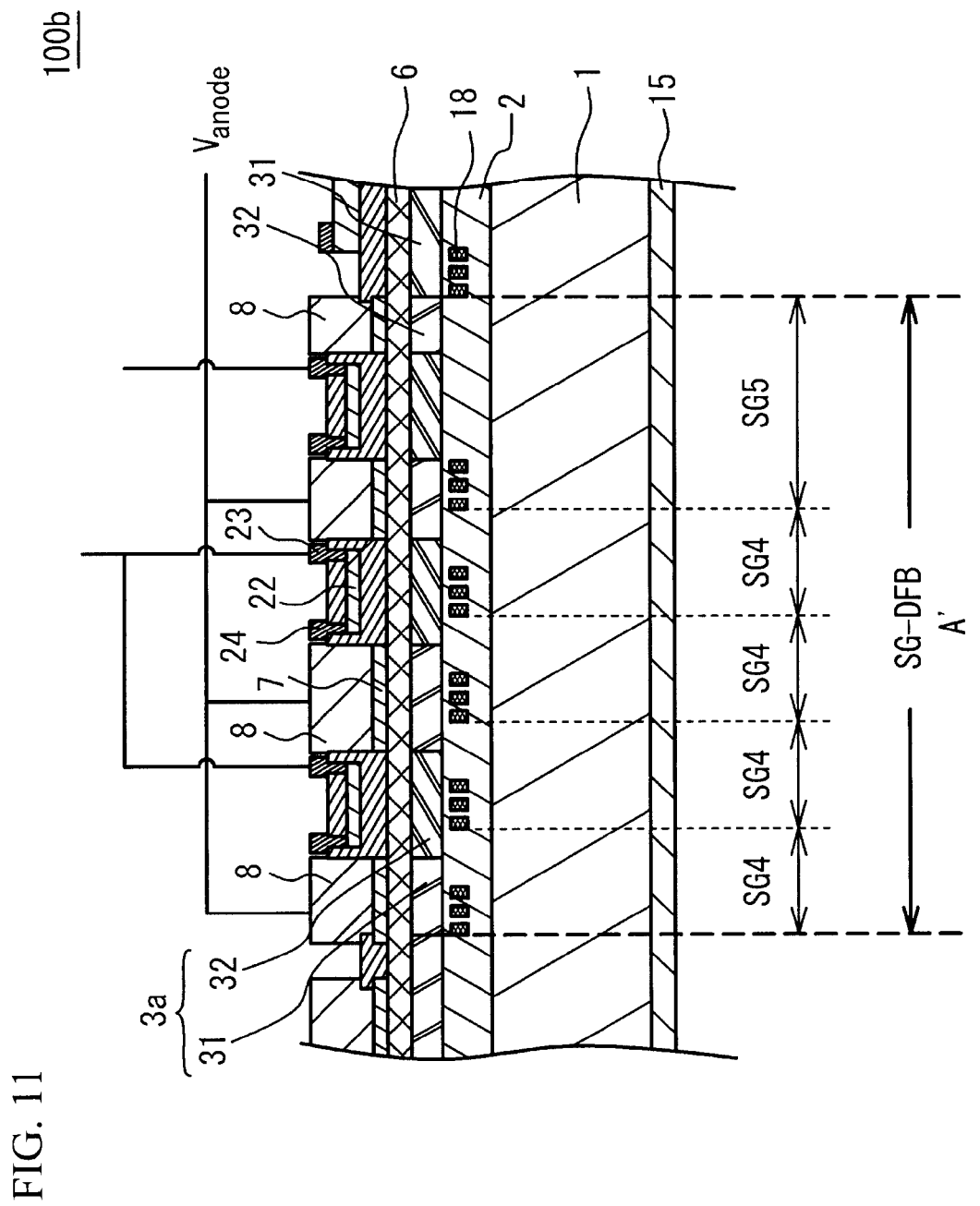
FIG. 11 illustrates a schematic cross sectional view of another semiconductor laser.

FIG. 11 illustrates an example in which each group of the gain region 31 and the passive waveguide 32 extends from one segment to another segment in the structure of FIG. 9. The length of the passive waveguide 32 and the heater 22 of each short-segment SG4 is approximately 160 μm. The length of the passive waveguide 32 and the heater 22 of the long-segment SG5 is approximately 160 μm. The length of the diffraction grating region of the short-segment SG4 and the long-segment SG5 is approximately 4 μm. The other structure is the same as the second modified embodiment and is thereby omitted. There is no segment to which the according gain region 31 of the short-segment SG5 on the side of the CSG-DBR region B extends. Therefore, the gain region 31 may not extend to another segment.

The Butt-Joint is an interface region between different semiconductor materials. The interface region can be formed when a region where the passive waveguide 32 is to be formed is subjected to an etching after the gain region 31 of the waveguide 3a is formed, a material that is different from the gain region 31 is re-grown, and the region is buried with the material. In this case, at a re-growth interface, it is difficult to make a shape that is optically ideal, because of an etching shape or an abnormal growth during the re-growing. Therefore, an undesirable reflection may occur more than a little. Crystal quality may be degraded. A threshold current may be increased, and an optical output may be reduced. That is, reduction of the Butt-Joint suppresses degradation of laser characteristics and degradation of reliability. When the number of the Butt-Joint is reduced, the total number of the electrode 8 and the heater 22 can be reduced. This results in reduction of risk such as short circuit caused by miniaturization of electrode pattern.

In accordance with the above-mentioned embodiments, in the SG-DFB region A, the optical length of the long-segment is larger than that of the short-segment by integral multiple plus-minus 25% of the short-segment. Therefore, the local maximum of the optical intensity of the propagation light "Pr" toward the rear sire gets smaller. Thus, the changing amount of the optical intensity gets smaller, and the optical intensity distribution in the resonator gets flatter. Accordingly, the unevenness of the carrier density in the resonator is suppressed, and the oscillation mode gets more stable. And, the interference effect among each segment is achieved because the optical length of the long-segment is larger than that of the short-segment by integral multiple plus-minus 25% of the short-segment. It is preferable that the optical length of the long-segment is near twice or integral multiple more than twice of that of the short-segment. This is because the interference effect among each segment gets larger. Therefore, it is preferable that the optical length of the long-segment is larger than that of the short-segment by integral multiple plus-minus 10% of the short-segment. It is more preferable that the optical length of the space region of the long-segment is twice or integral multiple more than twice of that of the short-segment.

In the above-mentioned embodiments, the long-segment is provided at the edge of the CSG-DBR region B side in the SG-DFB region A. However the structure is not limited. The long-segment may be provided in any position of the SG-DFB region A. However, when the long-segment is provided around the center of the resonator, the changing amount of the optical intensity is more suppressed. Therefore, it is preferable that the long-segment is provided near the edge on the side of the CSG-DBR region B. The number of the long-segment is not limited to one. There may be a plurality of long-segments in the SG-DFB region A.

In the above-mentioned embodiments, the CSG-DBR is used as the second reflector. However, an SG-DBR (Sampled Grating Distributed Reflector) having segments of which optical length is substantially the same may be used as the second reflector.

The SOA region C does not act as a laser resonator. Therefore, the effect of the above-mentioned embodiments does not depend on the length of the SOA region C. For example, in the above-mentioned embodiments, the SG-DFB region A, the CSG-DBR region B and the SOA region C is respectively approximately 1.26 mm, 1.12 mm and 1.5 mm. In this case, a total element length is approximately 3.88 mm. Therefore, "around a center of a resonator" means within 20% around the center of the element.

The present invention is not limited to the specifically disclosed embodiments and variations but may include other embodiments and variations without departing from the scope of the present invention.

What is claimed is:

1. A semiconductor laser comprising:
a first reflector that is provided in a gain region and has a sampled grating in which a plurality of segments are combined, the segment having a diffraction grating region and a space region next to the diffraction grating, both sides of the space region being sandwiched by a diffraction grating; and
a second reflector that is optically connected to the first reflector and has a sampled grating in which a plurality of segments are combined, the segment having a diffraction grating region and a space region next to the diffraction grating, both sides of the space region being sandwiched by a diffraction grating,
the plurality of segments of the first reflector having a short-segment region and a long-segment region,
the long-segment region having an optical length that is larger than that of the short-segment region and being positioned around a center of a resonator that includes the first reflector and the second reflector,
the optical length of the long-segment region being larger than that of the short-segment region in a range of integral multiple (n≥1) plus-minus 25% of the optical length of the short-segment;
the space region being longer than the diffraction grating region in the long-segment region and the short-segment region.

2. The semiconductor laser as claimed in claim 1 wherein the optical length of the long-segment region is larger than that of the short-segment region in a range of integral multiple (n≥1) plus-minus 10% of the optical length of the short-segment.

3. The semiconductor laser as claimed in claim 1 wherein a length of the diffraction grating region of the segment of the first reflector and the second reflector is 10% or less of a length of the segment.

4. The semiconductor laser as claimed in claim 1, wherein an optical length of at least two segments of the second reflector is different from each other.

5. The semiconductor laser as claimed in claim 1, wherein:
   the first reflector is optically connected to an active layer provided in the gain region; and
   the second reflector is optically connected to an optical waveguide of which energy gap is larger than that of the active layer.

6. The semiconductor laser as claimed in claim 1, wherein a width of the active layer according to the long-segment is different from a width of the optical waveguide of the second reflector.

7. The semiconductor laser as claimed in claim 1, wherein:
   a waveguide of the segment of the first reflector has a gain region having a gain and a passive waveguide not having a gain; and
   the first reflector has a portion that controls a refraction index of the passive waveguide.

8. The semiconductor laser as claimed in claim 7, wherein the portion that controls the refraction index of the passive waveguide is a heater.

9. The semiconductor laser as claimed in claim 8, wherein the heater according to the long-segment and the heater according to the short-segment are connected to a common power supply electrode.

10. The semiconductor laser as claimed in claim 9, wherein the heater according to the long-segment and the heater according to the short-segment are connected to electrode patterns that are electrically independent from each other.

11. The semiconductor laser as claimed in claim 1, wherein:
   the long-segment region is the closest to the second reflector; and
   the remaining segment regions of the first reflector other than the long-segment region are short-segment regions.

\* \* \* \* \*